United States Patent [19]

Caccoma et al.

[11] 4,342,090

[45] Jul. 27, 1982

[54] BATCH CHIP PLACEMENT SYSTEM

[75] Inventors: George A. Caccoma, Poughkeepsie; Joseph H. Koestner, Hopewell Junction; Brian C. O'Neill, Millbrook, all of N.Y.; Frank M. Tappen, Plantation, Fla.

[73] Assignee: International Business Machines Corp., Armonk, N.Y.

[21] Appl. No.: 163,671

[22] Filed: Jun. 27, 1980

[51] Int. Cl.[3] .............................................. G06F 15/46
[52] U.S. Cl. ...................................... 364/491; 29/740; 29/759; 29/834; 228/180 A; 318/640; 358/101; 364/559
[58] Field of Search .............. 364/474, 489, 490, 491, 364/559; 29/407, 740, 759, 771, 589, 703, 742, 783, 809, 743, 400 R, 832, 833, 834, 836; 228/102, 180 A, 180 R, 103, 9, 12, 179, 6 A; 318/640; 358/101, 107

[56] References Cited

U.S. PATENT DOCUMENTS

| | | | |
|---|---|---|---|
| 3,581,375 | 6/1971 | Rottmann | 228/102 X |
| 3,590,462 | 7/1971 | Mracek | 29/743 X |
| 3,611,561 | 10/1971 | Dosier | 29/759 X |
| 3,722,062 | 3/1973 | Gharaibeh | 29/742 X |
| 3,840,978 | 10/1974 | Lynch et al. | 228/180 A |
| 3,903,363 | 9/1975 | Montone et al. | 358/101 |
| 3,909,933 | 10/1975 | Doubek, Jr. et al. | 29/836 |
| 3,930,295 | 1/1976 | Rose | 29/759 |
| 3,988,535 | 10/1976 | Hickman et al. | 364/559 X |
| 4,040,169 | 8/1977 | Rose | 228/180 A X |
| 4,063,347 | 12/1977 | Woodman, Jr. | 29/703 X |
| 4,108,323 | 8/1978 | Shambelan et al. | 414/273 X |
| 4,116,348 | 9/1978 | Atchley et al. | 29/740 X |
| 4,116,376 | 9/1978 | Delorme et al. | 228/170 |
| 4,125,798 | 11/1978 | Miller | 364/474 X |
| 4,151,945 | 5/1979 | Ragard et al. | 29/740 X |

OTHER PUBLICATIONS

Patent Abstracts of Japan, vol. 2, No. 37, Mar. 13, 1978, p. 72E78.

K. G. Hoebener, "Multiple Size Chip Pickup, Orientation and Placement Station", IBM Technical Disclosure Bulletin, vol. 22, No. 7, Dec. 1979, pp. 2757 to 2761.

Caccoma et al., "Chip Orienter with Shrink Compensation for Gang Placement", vol. 20, No. 9, Feb. 1978–pp. 3449–3451.

Primary Examiner—Joseph F. Ruggiero
Attorney, Agent, or Firm—John A. Jordan

[57] ABSTRACT

A batch chip placement system for batch positioning semiconductor chips, or the like, upon a substrate containing an array of chip sites or footprints whose actual position on the substrate deviates from the theoretical or nominal position over successive substrates. The positioning is achieved by first sensing the X and Y offsets of a pair of alignment marks on the substrate from their theoretical or nominal position to determine the $\Delta X$ and $\Delta Y$ correction factors required to obtain the actual X,Y position of the alignment marks. The actual X,Y position of the alignment marks is used to determine actual X,Y chip position values, $\theta$ rotation and shrinkage factor corrections required to obtain proper orientation and positioning for batch chip placement.

33 Claims, 11 Drawing Figures

BATCH CHIP PLACEMENT SYSTEM

BACKGROUND OF THE INVENTION

1. Field of the Invention

The present invention relates generally to a method and apparatus for accurately locating and positioning electrical or electronic items at identified sites on substrates and, more particularly, to a method and apparatus for accurately batch positioning electronic circuits, components or chips onto identified sites (footprints) on multichip module (MCM) substrates.

2. Description of the Problem and Prior Art

In the fabrication of multichip modules for today's computers, electronic elements or components (e.g., transistors, diodes, capacitors, etc.) are closely integrated into the form of small "chips" which are mounted upon ceramic substrates. Before mounting the chips upon the substrate, the substrate is prepared for the multiple chips by providing it an array of chip sites with each chip site taking the form of a "footprint" or configuration of solder pads which match the electrical connections of the solder pad configuration on each of the respective chips. Typically, the solder pads of the chip are arranged on the same side of the chip as the chip components and may take the form of solder balls which are, after positioning on the substrate, bonded to corresponding substrate pads forming the "footprint".

With the trend toward smaller and smaller chips positioned in multiple form in closer and closer proximity to one another on a single substrate, chip handling and accurate chip placement on its "footprint" or site becomes more and more of a problem, particularly if it is desired to achieve automatic batch chip positioning on the substrate for high throughput. Compounding the problem is the fact that after the chip "footprints" or sites are created on the ceramic substrate, the substrate is fired for hardening and, as a result, a certain degree of shrinkage is introduced into the ceramic. Although the shrinkage within a given substrate is relatively uniform, the shrinkage factor varies considerably from substrate to substrate, thereby causing the chip site coordinates to vary from substrate to substrate.

In addition to variations in shrinkage factor, variations also exist from substrate to substrate in the orientation or alignment of chip sites and their X and Y offsets with respect to the edge of the substrate. These later variations occur as a result of the fact that although the respective location of sites may be positioned relatively accurately from site to site within a substrate, the position of the array of sites with reference to the substrate edge cannot be obtained with the same degree of accuracy. Accordingly, the X and Y coordinate offsets and rotation of the array of sites with respect to the substrate edge, along with the shrinkage factor, must be compensated for before accurate positioning can be obtained.

Various efforts have been made in the prior art to align electronic components, such as chips and the like, for positioning on substrates. Typical of prior art efforts is that described by H. R. Rottman in U.S. Pat. No. 3,581,375 issued June 1, 1971, and assigned to the assignee of the present invention. However, the Rottman system scans both chip and substrate to position one chip at a time and requires manual intervention. Likewise, U.S. Pat. No. 3,840,978, issued Oct. 15, 1974 to Lynch et al and assigned to the assignee of the present invention, describes an alignment system for positioning one chip at a time on a substrate utilizing manual techniques.

Further typifying prior art efforts to align chips and the like to substrates is that described in U.S. Pat. No. 4,125,798, issued Nov. 14, 1978, to Miller. Like Rottman and Lynch et al, Miller describes an arrangement for positioning one chip at a time on a substrate utilizing manual techniques. Another arrangement for positioning one chip at a time is that described by Atchley et al in U.S. Pat. No. 4,116,348, issued Sept. 26, 1978. Although Atchley et al describe a parallel feed arrangement for batch feeding of chips, the chips are picked up one at a time and positioned upon a substrate previously positioned to the proper X-Y location.

Although the prior art describes various arrangements for aligning chips to substrates, none of the prior art describes a high throughput arrangement for aligning multiple chips in a batch mode to a substrate, as described in accordance with the present invention. Gross batch positioning of wafers is described in U.S. Pat. No. 4,108,323 to Charles et al. However, Charles et al do not align their batch of wafers to any substrate arrangement but rather change the spacing between the wafers in accordance with the batch process step being undertaken. Thus, the wafers of the batch are spaced closely in a heat treatment step and then are spaced further apart, for example, in a subsequent chemical processing step.

Not only does the prior art fail to provide an arrangement for batch alignment and positioning of chips to wafers, it also fails to provide any arrangement for making predictions as to X, Y, $\theta$ and shrinkage factor corrections required to accurately align chips to a substrate in an automatic mode.

SUMMARY OF THE INVENTION

In accordance with the present invention, a batch chip placement system is provided for precisely batch positioning chips and the like upon a substrate containing an array of sites whose actual position on the substrate varies from the theoretical or nominal position over successive substrates.

This positioning is achieved by first sensing the X and Y offsets of alignment marks on the substrate from their theoretical or nominal position. A first alignment mark is optically located and the X-Y alignment table holding the substrate is automatically servoed to null the offset and calculate the $\Delta X$ and $\Delta Y$ correction factors. The process is repeated for a second alignment mark and the X-Y values of the two alignment marks are used to calculate the $\theta$ and shrinkage factor corrections. The X, Y, $\theta$ and shrinkage factor corrections are then used to vary from nominal the X, Y, $\theta$ and the spacing or periodicity parameters of prelocated chips relative to the module to obtain relative alignment of the chips to their sites on the substrate.

It is, therefore, an object of the present invention to provide an improved alignment and positioning system for aligning and positioning electronic components upon substrates.

It is a further object of the present invention to provide a high throughput batch chip placement system for aligning and positioning batches of chips upon substrates.

It is yet a further object of the present invention to provide batch chip placement system which is both automatic and precise.

It is still a further object of the present invention to provide a batch electronic component placement system which operates to predict correction factors required for accurate placement of the components upon a substrate.

It is yet still a further object of the present invention to provide a batch chip placement system which determines the X, Y, $\theta$ and shrinkage factor corrections required to be made for accurate placement of batches of chips upon a substrate.

DESCRIPTION OF THE PREFERRED EMBODIMENTS

Figure 1:
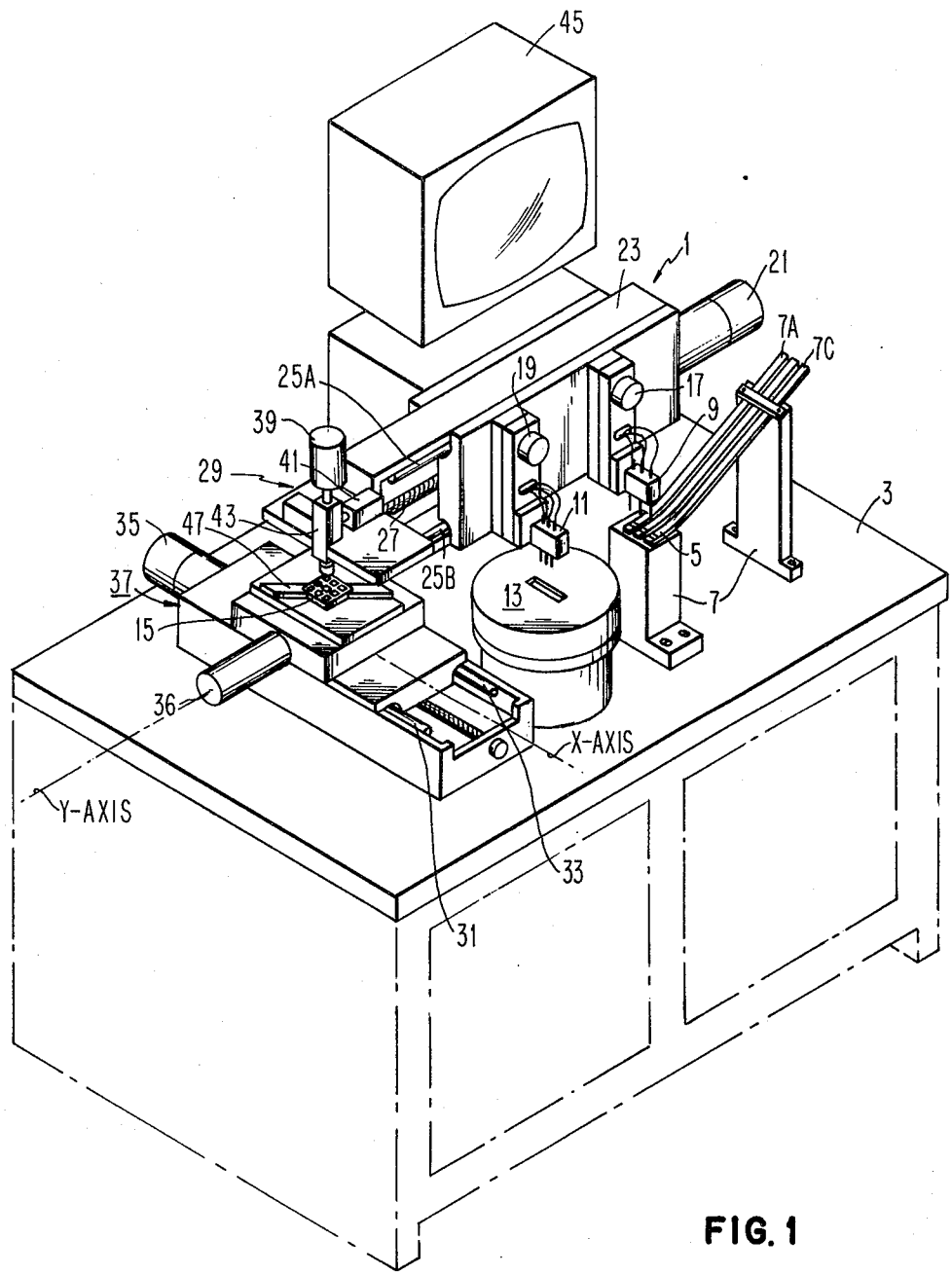
FIG. 1 shows a perspective view of the batch chip placement system, in accordance with the present invention.

With reference now to the drawings and particularly to FIG. 1, the batch chip placement system of this invention, shown enumerated generally at 1, is seen to include a cabinet arrangement 3 for supporting the electro-mechanical apparatus employed and for housing conventional control and processor circuitry. Chips are fed in parallel for positioning to chip pickup station 5 via parallel gravity feed chip banks 7A–7C. For purposes of simplicity, only 3 parallel feed chip banks are shown, but it is clear that any number of parallel chip feed banks may readily be employed, in accordance with the teachings of the present invention. Rather than be mounted on a gravity feed arrangement on chip feed base member 7, chip banks 7A–7C may be mounted on a base member which includes a linear vibrator arrangement which acts to vibrate the chips into position at the chip pickup station. Although reference is made herein to the term "chip", which typically includes transistors, diodes, resistors, capacitors, etc., in integrated circuit form, it is clear that discrete electrical elements or components such as these, as well as other types of elements, may as readily be batched positioned, in accordance with the principles of the present invention.

Again, with reference to FIG. 1, the chips fed to chip pickup station 5 are simultaneously picked up by vacuum pencil pickup assembly 9 and removed to batch shrink compensator 13. In similar fashion, chips on batch shrink compensator 13 are simultaneously picked up by vacuum pencil assembly 11 and removed to substrate 15. As can be seen, vacuum pencil assemblies 9 and 11 work in synchronism, with the former simultaneously picking up chips from pickup station 5 and moving same to batch shrink compensator 13 while latter operates to pick up chips from batch shrink compensator 13 and remove same to substrate 15.

Vacuum pencil pickup assemblies 9 and 11 simultaneously move in the vertical direction on their respective tracks (not shown) in response to signals provided servo motors 17 and 19, respectively. Tandem horizontal motion is imparted to pickup assemblies 9 and 11 by servo motor 21 driving horizontal transport assembly 23 on slider means, partially shown at 25A and 25B. Typically, servo motor 21 would rotate a lead screw arrangement, as shown at 27, to move assembly 23 in accordance with the directional signals given to the servo.

Although FIG. 1 shows the substrate positioned under optical alignment means 29, it is clear that after the alignment operation to determine the new X, Y and $\theta$ values in accordance with the present invention, the substrate is moved on X-axis sliders 31 and 33 and Y-axis sliders (not shown) in response to signals applied to servo motor 35 and 36, respectively, to position X-Y substrate table 37 to a point which is in alignment with vacuum pencil assembly 11. In such position, chips picked up from batch shrink compensator 13 by vacuum assembly 11 may be transported and positioned in an appropriate manner on substrate 15.

Optical alignment means 29 comprises a conventional arrangement of a standard vidicon camera 39, illumination source 41 and microscope 43. CRT graphic display device 45 is used to view the alignment operation wherein vidicon camera 39 scans, via microscope 43, the alignment mark illuminated by source 41. Electronic control of vidicon camera 39 causes the camera to scan the alignment mark brought within its capture range and determine its center point. The center point of the alignment mark is then centered on CRT display 45 and the $\Delta X$ and $\Delta Y$ distances required to center the mark on the CRT are stored in the system's processor memory.

It should be noted that any of a variety of conventional small general purpose processors may be employed to control the system described and process its information. For example, an IBM Series 1 minicomputer may be used although microprocessors, such as the Intel 8048, may as readily be employed with required I/O and power supply apparatus. Since the operations to be controlled and calculations to be made in the batch chip placement system of the present invention are relatively simple and straightforward, it will be readily apparent to one skilled in the art that standard routines using conventional programming languages and state of the art programming techniques may easily be employed in a number of different ways to program such processors for such operations and calculations.

Figure 2:
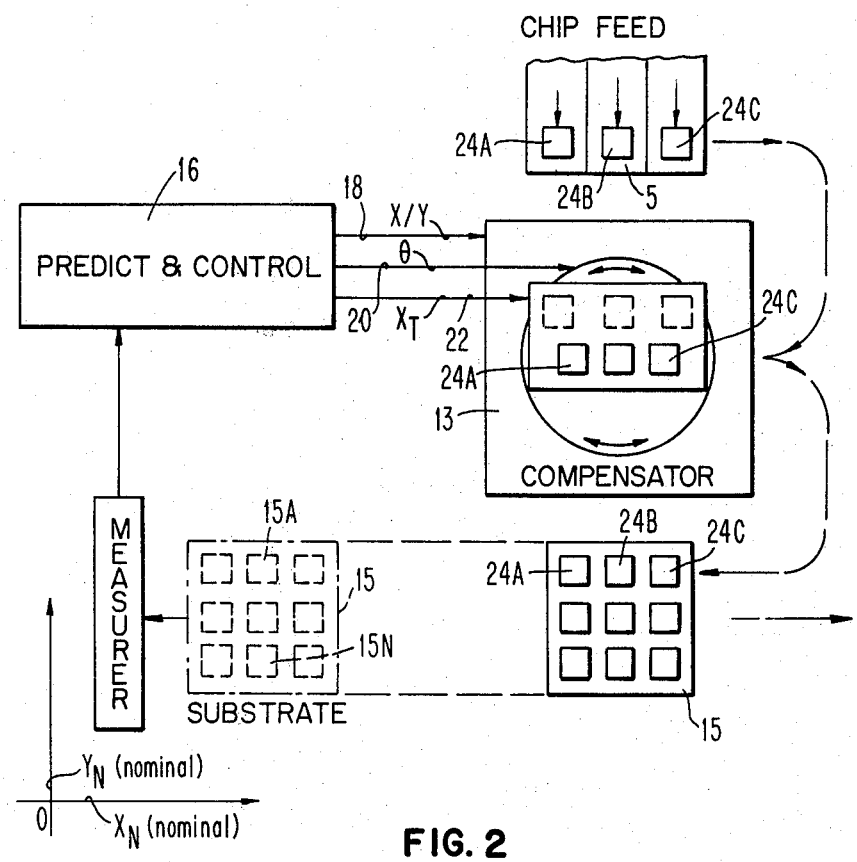
FIG. 2 shows a general block diagram arrangement depicting the overall manner in which the batch chip placement system, in accordance with the present invention, operates.

The general block diagram arrangement shown in FIG. 2 schematically depicts the overall manner in which the batch chip placement system, in accordance with the present invention, operates to measure the deviation in X, Y, $\theta$ and shrinkage factor E from their nominal values and feeds such information back to positioning means which act to place the chips, whereby the chips may precisely be positioned and aligned with the actual footprint configuration appearing on the substrate. Description of such operation may more clearly be understood by reference to both FIGS. 1 and 2 and the sequence of steps shown in the flow diagram of FIG. 6. Initially, the operator positions substrate 15 on X-Y table 37, shown in FIG. 1. This step is depicted by block 49 in FIG. 6. As can be seen, substrate 15 (in the example being considered) comprises a multi-chip module arrangement wherein 9 chips are to be positioned. Accurate registration of substrate 15 is achieved at this point by its being physically locked into position by four-point locator 47, shown in FIG. 1. As shown, the four-point locator acts to align the four sides of the substrate with its four locating surfaces.

Figure 6:
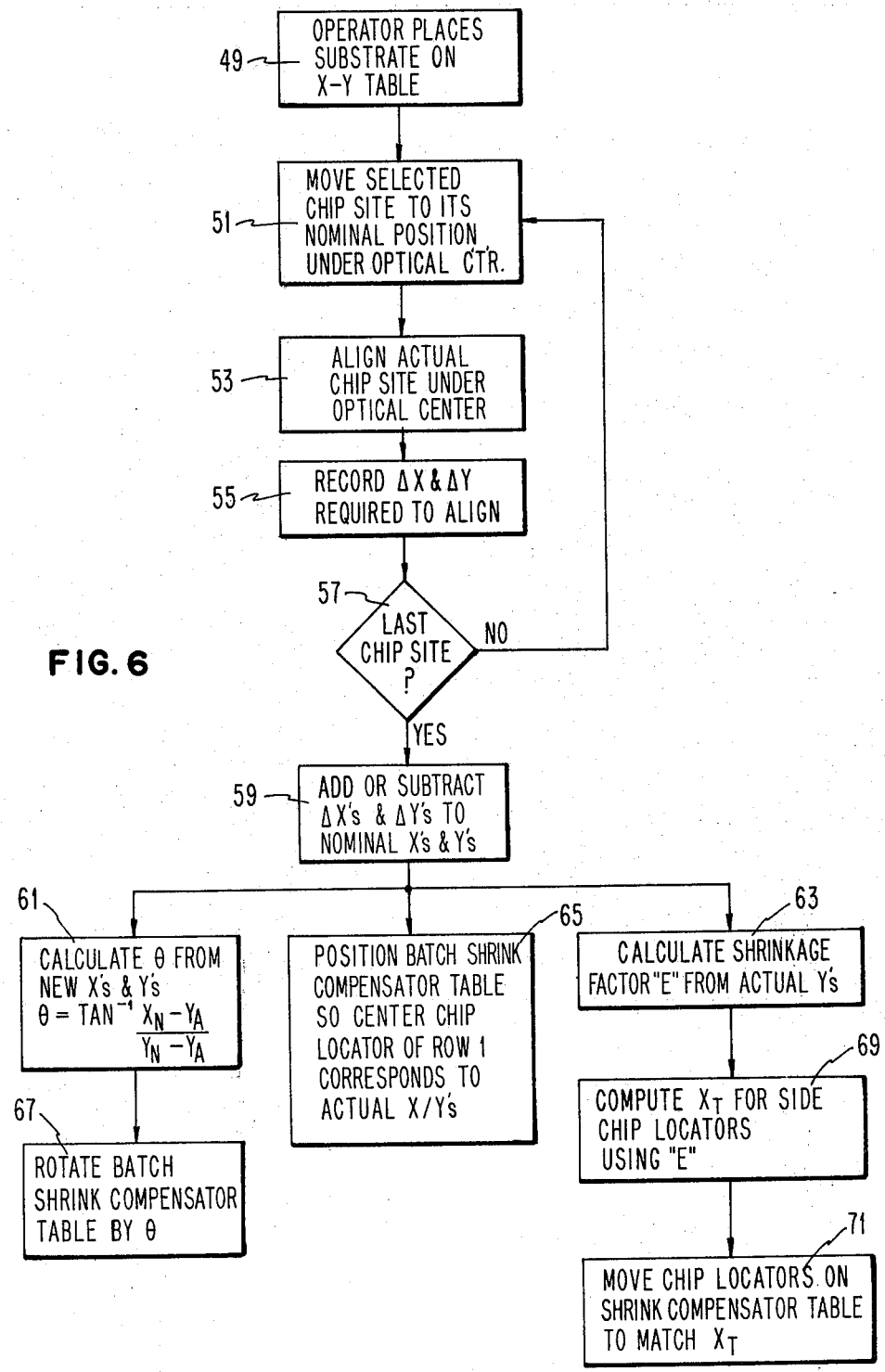
FIG. 6 shows a flow diagram of the sequence of steps involved in batch positioning chips on a substrate in accordance with the principles of the present invention.

As depicted by block 51 in FIG. 6, after the substrate has been positioned and located upon X-Y table 37 in FIG. 1, the table moves to position the nominal location of the first alignment mark to be scanned under the optical center of optical alignment means 29. In this regard, a pair of alignment marks at opposite sides of substrate 15 may accurately be positioned during substrate fabrication by forming the marks simultaneous with the formation of the array of "footprints" for the chips. By so doing, the alignment marks are in a fixed position with respect to the "footprint" array and variations in the actual location of the alignment marks from their nominal location would apply equally well to the "footprints". It should be understood that variation in the position of the array of footprints from their nominal or theoretical position may be introduced by mechanical error in the process step used to fabricate the footprints or variation from the nominal or theoretical shrinkage, as introduced during substrate sintering.

Alternatively, rather than employ a pair of separate alignment marks, a pair of chip "footprints" at opposing ends of the substrate may be employed as the alignment marks. Thus, as shown in FIG. 2, footprints 15A and 15N may be utilized as the alignment marks to be scanned. As hereinabove mentioned, these footprints are precisely located during the initial stages of fabricating the substrate, but subsequent forming, cutting and sintering steps act to cause the nominal location of the array of footprints to be misaligned with respect to the substrate edges. As indicated by block 53 in FIG. 6, the system control circuitry at this point acts to cause the optical alignment means to scan the solder pads of footprint 15A to determine its optical center.

After "footprint" 15A has been scanned by the optical system to determine its optical center, processor control circuitry acts to move X-Y table 37 to position the actual center point of 15A with the center position of CRT display 45 (nominal position) and the ΔX and ΔY distances required to center the optical center of footprint 15A on the CRT are stored in the system's processor memory, as hereinabove stated. This optical compare step is represented by block 55 in FIG. 6. As shown by block 57 in FIG. 6, where this is not the last chip site to be centered, the process is again repeated by returning to the step depicted by block 51. Accordingly, the optical alignment process again operates, this time on "footprint" 15N as shown in FIG. 2, and the results are stored in the processor memory as represented by block 55.

As represented by blocks 57 and 59 in FIG. 6, when the last chip site, or "footprint", to be optically aligned has been encountered, the system processor acts to appropriately add or subtract the ΔX's and ΔY's to the nominal X and Y values of "footprints" 15A and 15N whereby the actual X,Y location of these marks or footprints with respect to the coordinate axis shown in FIG. 2 is determined. The predict and control function carried out by the system processor at this point is depicted by block 16 in FIG. 2. In accordance with such operation, the actual position of footprints 15A and 15N is employed by the processor to calculate $\theta$ and the shrinkage factor E, as depicted by blocks 61 and 63 in FIG. 6. In this regard, it is clear that any rotational or $\theta$ misalignment may be computed as follows:

$$\text{Tan } \theta = \frac{X_A - X_N}{Y_A - Y_N}$$

where $X_A$ is the actual X value of "footprint" 15A, $X_N$ is the actual X value of "footprint" 15N, $Y_A$ is the actual Y value of "footprint" 15A and $Y_N$ is the actual value of "footprint" 15N.

Likewise, the shrinkage factor E may be computed ad follows:

$$E = \frac{Y_N - Y_A}{\cos \theta} \cdot \frac{1}{Y_{N(nominal)} - Y_{A(nominal)}}$$

where $Y_N$ and $Y_A$ are the actual Y values of "footprints" 15N and 15A and $Y_{N(nominal)}$ and $Y_{A(nominal)}$ are the nominal Y values of "footprints" 15N and 15A. Once E has been determined, its deviation from the nominal shrinkage factor may be used to find the predicted X value of chip sites on each side of the center chip sites used as alignment marks. It should be understood that batch chip compensator 13 in FIG. 2 is not only used to correct for variations in actual "footprint" position from the nominal, but is also used to merge the chips closer together (or further apart) for positioning on the substrate. Since chip feed mechanism 5 has physical constraints or limits on locating the chips in very close proximity to one another, batch shrink compensator is provided to reduce the relative positioning of the chips as they appear at chip feed 5 down to the close positioning required for linear translation to substrate 15.

Thus, the X value of the location of chip footprints on each side of center chip footprints 15A and 15N reflects not only correction for shrinkage factor E but also the amount of reduction required to merge the chips together for the close chip positioning used on substrate 15. The X values, $X_T$, of the side chips, as corrected for shrinkage factor E, may be determined as follows:

$$X_T = X_{(nominal)} \cdot E$$

where $X_{(nominal)}$ is the nominal X value of the chip site on the substrate and E is the shrinkage factor multiplier used to vary $X_{(nominal)}$.

It should be noted that the $X_T$ values calculated for each chip site on opposing sides of center chip site 15A may be used for each successive row of chip placements since typically shrinkage in ceramic substrate material has been found to be linear and symmetrical about the center of the substrate. In this regard, shrinkage after sintering of 15 percent to 20 percent is not unusual.

It should be appreciated that although description has been directed to the use of a pair of alignment marks, be they footprints or marks provided for alignment, any number of alignment marks may be used in accordance with the particular application. Thus, where a large chip array is being processed, it may be necessary to use several alignment marks for purposes of computing shrinkage E or X, Y and $\theta$ values for various sectors of the chip. Alternatively, it is possible to operate the system of the present invention to optically locate and determine the X, Y and θ values for every footprint, i.e. each chip site, on the substrate in a mapping-type mode.

Figure 3:
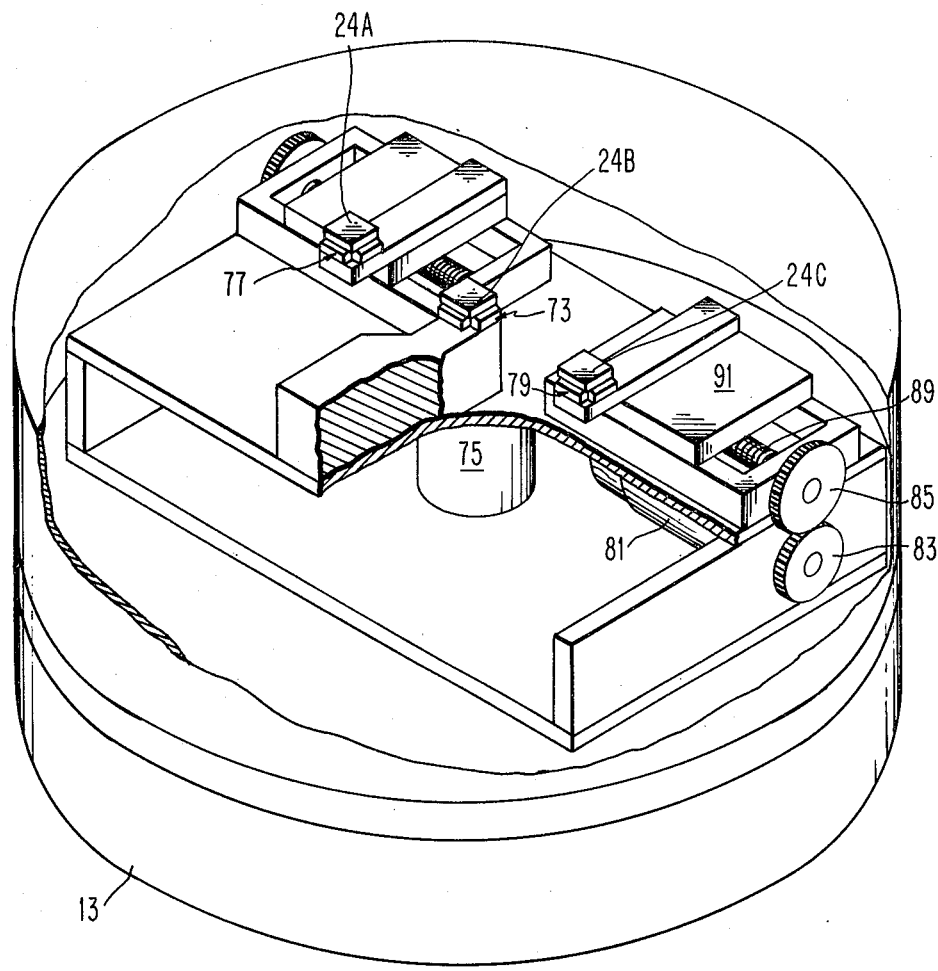
FIG. 3 shows a detailed view of the batch shrink compensator used in the batch chip placement system of FIG. 1.

Some time during or after the calculation of θ and E, the actual X,Y values of the center chip location may be sent to batch shrink compensator 13, as shown in FIG. 2. In this regard, the actual location of the center chip for each row of chips is employed as the reference point from which the locations of chips on opposing sides of the center chip may be determined. Upon receiving the actual coordinates of the center chip footprint 15A, batch shrink compensator 13 positions chip locator 73 holding chip 24B, as shown in FIG. 3, to the actual coordinate values of the center chip footprint. Chip locator 73 is positioned to the actual coordinate values of the center chip footprint via a servo motor and slide means, (not shown) to move the whole of batch chip compensator 13 to the appropriate coordinate position. With reference to FIG. 2, the actual X,Y coordinate values of center chip footprint 15A are fed to compensator 13 via line 18. Likewise, the θ correction value is fed to batch shrink compensator 13 via line 20 and $X_T$ is fed via line 22. With reference to FIG. 3, the θ correction value operates to cause a servo motor (not shown) to rotate shaft 75 the required number of degrees to correct for θ misalignment.

With chip locator 73, in FIG. 3, positioned at the actual X,Y coordinate values of center chip footprint 15A and the compensator rotated about this X,Y position by θ degrees to correct for orientation errors, chip locators 77 and 79 may be positioned in accordance with the $X_T$ values, determined as hereinabove described. Operation of these steps is depicted by blocks 65 and 67 in FIG. 6. Likewise, calculation of the shrinkage factor "E" is depicted by block 63 in FIG. 6. After the periodicity or $X_T$ is calculated, as shown by block 69 in FIG. 6, chip locators 77 and 79, as shown in FIG. 3, are positioned in accordance with the calculated $X_T$ values. This is depicted by block 71 in FIG. 6. Positioning of chip locator 79, for example, as shown in FIG. 6 is achieved through servo motor 81 acting upon gears 83 and 85 to rotate lead screw 89 whereby table 91 is appropriately positioned. Chip locator 77 operates in similar fashion. It is clear, however, that any of a variety of arrangements may readily be employed to appropriately move the chip locators.

It should be appreciated that the batch shrink compensator depicted in FIG. 2 illustrates the manner in which chips are moved from a separated position to a merged position, as is achieved by the operation of the servos in FIG. 3. Thus, the chips in broken lines represent the chips positioned in a separated position in line with chip feed apparatus 5, and the chips in solid lines represent the same chips shown in broken lines in a merged position ready for pickup and placement on substrate 15. With the 3-row chip arrangement shown in FIG. 2, it is clear that with the actual X,Y values of "footprints" 15A and 15N known, the footprint of the center chip in the center row may be determined by dividing the actual Y values of footprints 15A and 15N by 2. In such an arrangement, the shrinkage value E need not be employed to correct for variations in shrinkage from the nominal in the Y direction. However, where more complex substrates are employed using, for example, 25 "footprints" in a 5×5 array, it is clear that the periodicity of the rows in the y direction would need correction for variations in the nominal periodicity due to shrinkage value variations from the nominal. Thus, after having positioned the chip locator for chip site 15A to the actual position of the site, the location of the center chip in each subsequent row would be corrected in the Y direction in accordance with the shrinkage factor "E", i.e. variations in shrinkage factor from the nominal shrinkage factor. In such an arrangement, the actual Y values of the center chip site in the rows between the first and last row would be accessed by incrementing from the first row an amount equal to the nominal distance between the first and second rows corrected for by shrinkage factor E, and so on. It should be appreciated that since the nominal periodicity between rows is constant and the shrinkage factor is constant, each successive row (after the positioning of the first row) may be found by incrementing a constant or fixed amount from the previous row.

With X,Y θ and $X_T$ determined, chip placement proceeds in the following manner. With batch shrink compensator 13 in its home position, i.e. with the chip locators in the expanded position and aligned with the tracks of chip feed pickup station 5, vacuum pencil 9, shown in FIG. 1, removes chips from the chip feed and positions them in the respective chip locators. This is shown by the broken line chips in FIG. 2. Thereafter, batch shrink compensator 13 is moved and positioned so that its center chip locator position corresponds to the actual X,Y position values determined. Data correction is then made and the chip locators on opposing sides of the center chip locator are moved to the calculated $X_T$ value, as previously described. Thereafter, vacuum pencil pickup 11 picks up the respective chips from their compensated position and linearly moves them to their respective "footprints" on substrate 15, now in its chip place position at the right in FIG. 2. Thus, it can be seen that the compensator acts to position the chips in a configuration that matches the actual configuration of "footprints" on the substrate.

In summary, the substrate upon which chips are to be positioned is first measured to obtain parameter values indicative of the amount of deviation from what would be the nominal of theoretical configuration of "footprints" on the chip, correction values are then calculated for each footprint, rows of chips are positioned upon a compensator so that their positions may be adjusted to correspond to the actual positions of the "footprints" on the substrate and finally, the rows of chips are positioned in parallel upon their matching row of "footprints".

It should be appreciated that rather than move the whole batch shrink compensator so that the center chip of a row corresponds to the actual X,Y values, as an alternative, the substrate X,Y table 37 may be moved so that the center chip site or "footprint" of the particular row in question is positioned in accordance with its actual X,Y values rather than its theoretical X,Y values. Thus, the center of the actual position of the center "footprint" is aligned with the center probe or vacuum pencil pickup assembly 11, as shown in FIG. 1. In accordance with such a scheme, the actual X,Y values fed to batch shrink compensator 13 via line 18 are, instead, fed to servo motors 35 and 36 of the X,Y substrate table 37, shown in FIG. 1.

Figure 4:
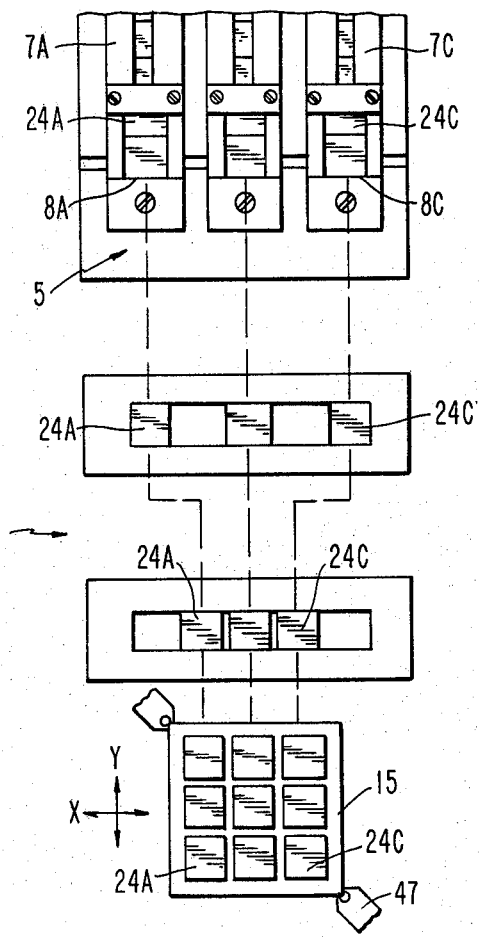
FIGS. 4, 4A and 4B shows the details of the manner in which chips are fed in parallel to the batch shrink compensator for individual correction, placement and subsequent batch positioning on a chip.

FIG. 4 depicts a further diagramatic showing of the manner in which chip feed and pickup station 5 and batch shrink compensator 13 interact, in sequential fashion, to position the chips for final precise placement on substrate 15. Coarse chip positioning is first achieved through the action of chip feed tracks 7A–7C feeding the chips by gravity feed to chip pockets 8A–8C, as shown in FIG. 4. The chip pockets are shown in more detail in FIG. 4A. As shown there, the chip feed track 7 narrows down to the size of the chip pocket 8, which is slightly larger than the X dimension of the chip. Although only 3 banks of chips are being fed via the 3 tracks shown, it is clear that the modular design of the arrangement would readily permit expansion to additional tracks and chip pockets for parallel chip placement. Adjustment screw 10 permits variable chip grid spacing to suit any product requirement. Thus, the respective X locations of an array of chips and distances therebetween may be coarsely located through utilization of adjustment screw 10. Adjustment screw 10 also facilitates Y alignment. If greater X position accuracy is required, a light finger spring or jet of air may readily be employed to drive the chips in chip pockets 8 against the pocket sidewall, thus fixing the X reference.

Figure 4A:
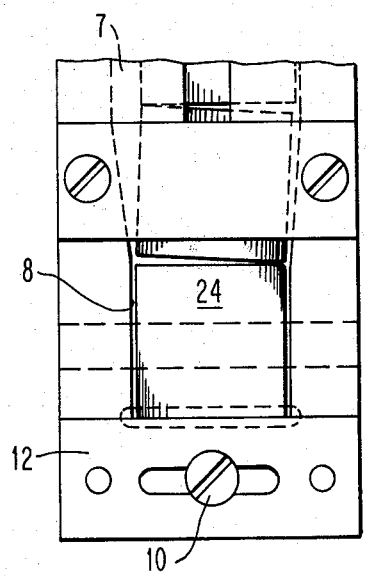
Figure 4B:
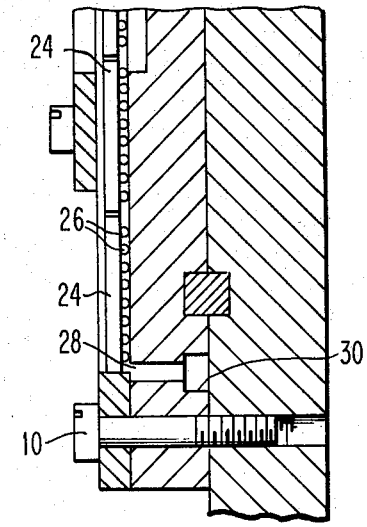

Positioning in the Y direction for the coarse locating action of the chip feed and pickup station 5 is achieved through utilization of the leading edge of the chip abutting stop plate 12, shown in FIG. 4A. In this regard, it should be understood that where, for example, chips with solder balls are used, less precision is achieved using the chip's edge as a reference than would be achieved using the solder balls directly. This is shown more clearly in FIG. 4B where the edge of chip 24 is employed as a reference in the coarse locating function carried out here, as opposed to employing the solder balls 26 as a reference. This is so due to the fact that, typically, dicing tolerances of the chip's edge are more coarse than solder ball tolerances. Self clean port 28 in FIG. 4B is employed to keep the locating surface of stop plate 10 free of debris. Slot 30 beneath the self-cleaning port permits cleaning via air or vacuum.

A fine chip locator function using solder balls, for example, as a reference is achieved by the action of chip locators 73, 77 and 79 positioned on batch shrink compensator 13, as previously described with reference to FIG. 3. The detailed manner in which the fine chip locating function may be achieved will be described with reference to the chip locator structure shown in FIG. 5. It is clear, however, that different locator structures may be employed where different workpiece items are to be positioned, in accordance with the particular application.

Figure 5B:
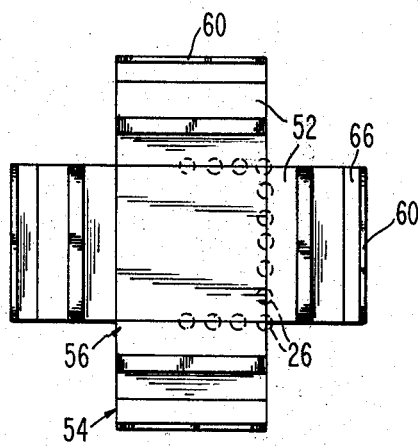
FIGS. 5, 5A and 5B show the details of the fine chip locator feature used to locate and hold individual chips on the batch shrink compensator shown in FIG. 4.
Figure 5A:
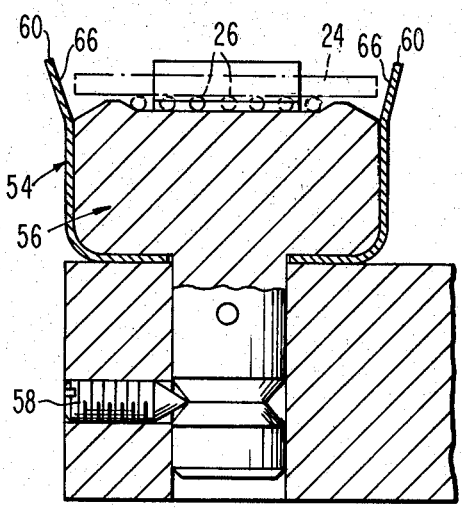
Figure 5:
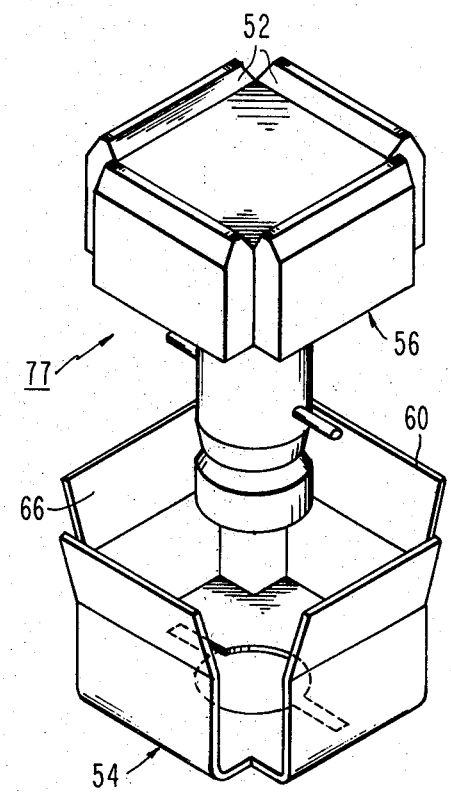

In the exploded view shown in FIG. 5, slope surfaces 52 act to guide the solder balls of the chip into a precisely defined recess location. Spring clip structure 54 fits over locator body 56 to guide the edges of the chip so that the solder balls will be guided toward the top portions of slope surfaces 52. This is shown in more detail in FIG. 5A wherein it can be seen that the edges of chip 24 are initially guided by the flanged portions 66 of spring clip 54. As hereinabove mentioned, since the location of the solder balls is given with more precision than the edges of chip 24 due to dicing tolerances, relatively fine positioning is achieved within the recess or pocket of locator 56, independent of chip edge. As is evident, screw arrangement 58 permits the removal of the chip locator from batch shrink compensator 13 to accommodate cleaning, repair or change.

FIG. 5B shows a top view of the arrangement shown in FIGS. 5 and 5A. It should be appreciated that by separating the coarse chip locating function described in FIG. 4 from the fine chip locating function described in FIG. 5, the interference between these two functions is eliminated, and the physical limits seen in conventional designs constraining close positioning is avoided.

In this regard, it should also be appreciated that as batch shrink compensator 13 merges the chips into a closely-spaced array or row, as hereinabove described, the flanged portions 66 of spring clips 54 may come into contact with one another. Because of the resilience of these flanged portions, close proximity of the chips is achieved, the limits of separation not being significantly greater than the thickness 60 of the spring clips. Accordingly, not only does batch shrink compensator 13 permit precise positioning of a complete row of chips with positional corrections being made for $\theta$, X,Y coordinates and shrinkage factor, but batch shrink compensator also allows extremely close positioning of the chips as required for high density packaging.

Figure 7:
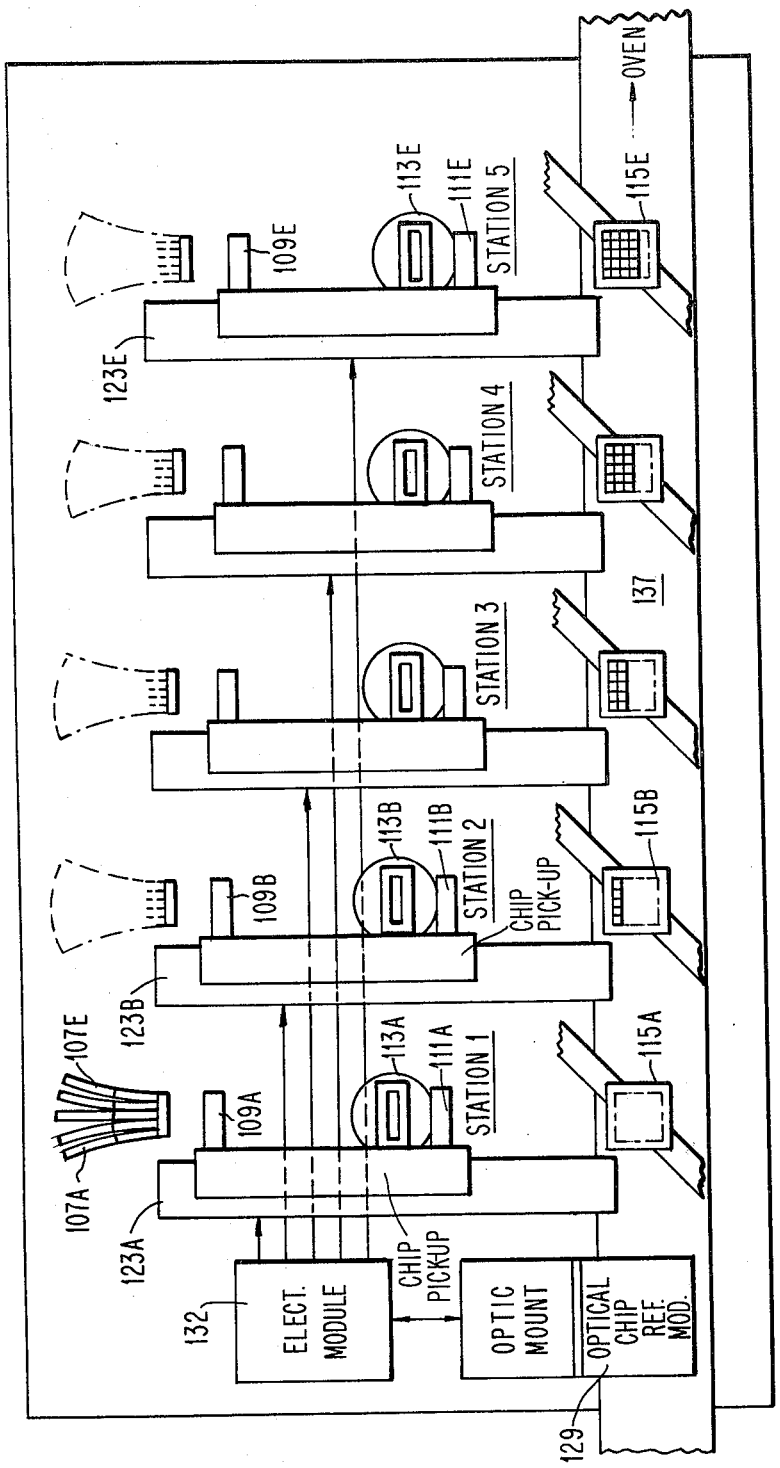
FIG. 7 shows an extension of the batch chip placement system of FIG. 1 for multiple batch chip placement.

In addition to high density packaging and precise positioning, the arrangement in accordance with the present invention accommodates the high throughput requirements of modern technology. Although the batch shrink compensator arrangement described hereinabove permits positioning a complete row of chips upon a substrate, even higher throughput may be achieved through utilization of a multiplicity of batch shrink compensators operating in parallel. Such a typical parallel arrangement is shown in FIG. 7. In the high throughput arrangement shown here, a substrate having a 5×5 array of chips is being fabricated. The assembly scheme utilizes five stations so that each row of the chip is positioned by a different station. Horizontal transport assemblies 123A–E, used to transport chips from chip banks 107A–E to substrate 115, operate in a manner similar to horizontal transport assembly 23 shown in FIG. 1. Substrates are positioned at the various stations via conveyor belt 137.

Blank substrates enter the system on a transport mechanism, such as conveyor belt 137, and are positioned under optical alignment means 129 (designated optical chip reference module) in FIG. 7. Optical alignment means 129 operates in a manner akin to optical alignment means 29 hereinabove described with respect to FIG. 1. As previously described, optical alignment means 129 operates to determine the actual X,Y position of a pair of alignment marks and the coordinates of the actual position of the pair of alignment marks is then utilized by electronic module 132 to calculate $\theta$, shrinkage factor E and $X_T$ for each of the respective rows of chips to be positioned upon this substrate. The X,Y $\theta$ and $X_T$ values for each of the respective rows are sent to respective batch shrink compensators 113A–E, at stations 1–5. As hereinabove described, electronic module 132 may comprise any of a variety of conventional data processing and control apparatus. Typically, an IBM Series I minicomputer may readily be employed to carry out the operation described.

After optical alignment has been completed, conveyor belt 137 is incremented to the next substrate and optical alignment is again undertaken. At the same time, the first row of chips is positioned on substrate 115A at station 1 in a manner akin to that with respect to FIG. 1. As successive chips progress along on conveyor belt 137, the respective stations position their assigned row of chips on the substrates with each of the stations operating in parallel such that when Stations 5 positions the fifth row of chips upon the first substrate to appear, Station 1 is simultaneously applying the first row of chips to the fifth substrate to appear.

It is clear that substrates having an increased array of chips would require a corresponding increase in a number of stations. Likewise, a substrate having an increased array of chips would require an increase in the number of chip feed banks 107 and the number of vacuum pickup probes associated with vacuum pickup assemblies 109 and 111.

After positioning the last row of chips upon substrate 115, conveyor belt 137 may position the filled substrates in an oven arrangement whereby the chip electrical contacts may be bonded to the substrate contacts. As can be seen, the scheme in FIG. 7 increases throughput by a factor corresponding to the size of the array of chips to be positioned. Thus, in the 3×3 chip array hereinabove described, utilization of the arrangement of FIG. 7 would increase throughput by approximately of factor of 3. It is also clear by the arrangement shown in FIG. 7 that where stations in excess of the number required for a given substrate are provided, one station being down will not affect the entire line since the down station may be bypassed in favor of a spare station being utilized down line.

While the invention has been particularly shown and described with reference to the preferred embodiment thereof, it will be understood by those skilled in the art that various changes in form and detail may be made therein without departing from the spirit and scope of the invention.

We claim:

1. A batch component placement system for the batch positioning of components at pre-assigned sites upon a substrate where the sites vary in position from substrate to substrate, comprising:
    substrate means having pre-assigned sites including at least one pair of alignment marks thereon;
    optical means for locating the actual position of said pair of alignment marks on said substrate means;
    means to compare the actual position of said pair of alignment marks with the theoretical position of said marks to determine the amount of misalignment;
    a plurality of component locator means, each one of which is arranged to align and locate a component thereon;
    means to position components on each of said plurality of component locator means;
    means to individually position each of said plurality of component locator means in accordance with said amount of misalignment; and
    component pickup means to remove said components from each of said plurality of component locator means and position same at said pre-assigned sites upon said substrate means.

2. The batch component placement system as set forth in claim 1 wherein said components are circuit chips each having an array of contact points on one side thereof.

3. The batch component placement system as set forth in claim 2 wherein said pre-assigned sites comprise an array of connection points matching said array of contact points on the said one side of said circuit chips.

4. The batch component system as set forth in claim 3 wherein said array of contact points on the said one side of said circuit chips comprise an array of solder balls.

5. The batch component placement system as set forth in claim 4 wherein each of said plurality of component locator means include a recess having tapered walls arranged to cause the said solder balls on one side of said chip to slide thereon to finely locate said chip within said recess.

6. The batch component placement system as set forth in claim 5 comprising batch chip feed means including a plurality of parallel feed banks which act to feed chips via tracks to respective ones of a plurality of parallel chip pockets whereby said chips are coarsely located.

7. The batch component placement system as set forth in claim 6 wherein said means to position components on each of said plurality of component locator means comprise parallel vacuum pickup means for picking up in parallel the respective chips located in the said plurality of parallel chip pockets of said batch chip feed means.

8. The batch component placement system as set forth in claim 7 wherein said alignment marks each comprise one of said pre-assigned sites comprising said array of connection points.

9. The batch component placement system as set forth in claim 8 wherein said optical means includes vidicon camera means.

10. The batch component placement system as set forth in claim 7 wherein the difference between the said actual position of said pair of alignment marks and said theoretical position of said pair of alignment marks is used to determine the variation in orientation of said actual alignment marks from said theoretical alignment marks.

11. The batch component placement system as set forth in claim 10 wherein the difference between the said actual positions of said pair of alignment marks is used to determine the amount of shrinkage encountered by said substrate after assignment of said pre-assigned sites.

12. The batch component placement system as set forth in claim 11 wherein said plurality of component locator means are positioned by the said means to individually position in accordance with said variation in orientation and said amount of shrinkage.

13. A batch chip placement system for batch positioning rows of electronic chips to pre-assigned sites upon a substrate where the position of said sites varies from substrate to substrate, comprising:
    substrate means having pre-assigned sites thereon including at least one pair of alignment marks with each of said sites for receiving said chips including an array of electrical contact points;
    optical alignment means for locating the actual position of said pair of alignment marks on said substrate means;
    means to compare the said actual position of said pair of alignment marks with the theoretical position of said pair of alignment marks to determine the extent of misalignment in position and orientation between said actual position and said theoretical position of said marks;
    batch compensator means including a plurality of chip locator means each one of which is arranged to align and locate a chip thereon;
    means to position chips on each of said plurality of chip locator means;
    means to position said batch compensator means relative to said substrate means in accordance with the actual position of said pair of alignment marks so that one of said chip locator means is lineally related to the actual position of one of said pre-assigned sites for receiving said chips;

means to rotate said batch compensator means about said one of said chip locator means to correct for said misalignment in orientation; and pickup means to remove said chips from each of said plurality of chip locator means and position same at said pre-assigned sites upon said substrate means.

14. The batch chip placement system as set forth in claim 13 wherein the difference between the actual positions of said pair of alignment marks determines the amount of shrinkage encountered after said pre-assigned sites are positioned upon said substrate means.

15. The batch chip placement system as set forth in claim 14 wherein the said plurality of chip locator means of said batch compensator means are arrayed in a row and wherein means are provided to position each of said chip locator means other than said one of said chip locator means to correct for said amount of shrinkage.

16. The batch chip placement system as set forth in claim 15 wherein each of said chips includes an array of solder balls on one side thereof matching the said array of electrical contact points of said sites on said substrate means.

17. The batch chip placement system as set forth in claim 16 wherein individual chip locator means of said plurality of chip locator means each comprise a holding means having a top recess with tapered side walls arranged to guide the said solder balls on the one side of said chip to finely locate said chip within said recess.

18. The batch chip placement system as set forth in claim 17 comprising batch chip feed means including a plurality of parallel feed banks which act to feed chips via tracks to respective ones of a plurality of parallel chip pockets whereby said chips are coarsely located.

19. The batch chip placement system as set forth in claim 18 wherein said means to position chips on each of said plurality of chip locator means comprises parallel vacuum pick-up means for picking up in parallel the respective chips located in the said plurality of chip pockets of said batch chip feed means and positioning same on respective ones of each of said plurality of chip locator means.

20. The batch chip placement system as set forth in claim 19 wherein said alignment marks each comprise one of said pre-assigned sites including an array of electrical contact points.

21. The batch chip placement system as set forth in claim 20 wherein said substrate means includes an NXN array of pre-assigned sites and wherein said batch compensator means with one compensator means assigned to position chips for each respective row of chips of said substrate.

22. The batch chip placement system as set forth in claim 20 wherein said one of said chip locator means is the center chip locator means.

23. A batch chip placement process for batch positioning rows of electronic chips at pre-assigned sites upon a substrate where the theoretical position of said sites varies form substrate to substrate, comprising the steps of:

positioning substrate means having said pre-assigned sites thereon including at least one pair of alignment marks within the captive range of optical alignment means;

optically scanning said alignment marks to locate the actual position of said pair of alignment marks on said substrate means;

comparing the said actual position of said pair of alignment marks with the theoretical position of said pair of alignment marks to determine the extent of misalignment in position and orientation between the said actual position and the said theoretical position of said pair of alignment marks;

positioning of row of chips so that each chip is referenced to a known point;

moving said row of chips relative to said substrate means in accordance with said extent of misalignment in position so that one of the chips of said row of chips is in a position which is lineally related to the actual position of the corresponding one of said pre-assigned sites;

rotating said row of chips about said one of said chips to correct for said misalignment in orientation; and lineally moving said row of chips to position same at said pre-assigned sites upon said substrate means.

24. The batch chip placement process as set forth in claim 23 wherein the difference between the actual positions of said pair of alignment marks is used to determine the amount of shrinkage encountered after said pre-assigned sites are fabricated upon said substrate means.

25. The batch chip placement process as set forth in claim 24 comprising the further step of moving each chip of said row of chips other than said one of said chips to correct for said amount of shrinkage.

26. A batch component placement system for positioning components at sites on a substrate where the sites vary in position from substrate to substrate, comprising:

substrate means having sites thereon including component sites;

automatic means for locating the position of said sites on said substrate means;

a plurality of component locator means positionable with respect to one another; and means to individually position with respect to one another said plurality of component locator means in accordance with the located position of said sites.

27. The batch component placement system as set forth in claim 26 including batch component pickup means for batch moving components from said plurality of component locator means to component sites on said substrate means.

28. The batch component placement system as set forth in claim 27 wherein said automatic means for locating the position of said sites on said substrate means includes optical means for locating the position of said sites on said substrate means.

29. The batch component placement system as set forth in claim 27 wherein said components are circuit chips each having an array of contact points on one side thereof.

30. The batch component placement system as set forth in claim 29 wherein said component sites include an array of connection points matching the said array of contact points on the said one side of said circuit chips.

31. The batch component placement system as set forth in claim 30 wherein said automatic means for locating the position of said sites on said substrate means includes means to measure the location of at least two of said sites on said substrate means whereby the difference between the measured location and the theoretical location of said sites is used to provide translation, rotation and shrinkage adjustment to said means to individually position each of said plurality of component locator means.

32. The batch component placement system as set forth in claim 26 wherein said automatic means for locating the position of said sites on said substrate means includes means to measure the location of at least two of said sites on said substrate means whereby the difference between the measured location and the theoretical location of said sites is used to provide translation, rotation and shrinkage adjustment to said means to individually position each of said plurality of component locator means.

33. A batch component placement method for positioning components at sites on a substrate where said sites vary in position from substrate to substrate, comprising the steps of:
  locating the position of at least two sites on said substrate;
  individually positioning remote from said substrate each of a plurality of components with respect to one another in an array in accordance with the located position of said sites on said substrate; and
  moving in a single step said plurality of components to said substrate in the same relative position as they appear in said array.

* * * * *